US008629865B2

(12) United States Patent
Loebl et al.

(10) Patent No.: US 8,629,865 B2
(45) Date of Patent: Jan. 14, 2014

(54) ORGANIC LIGHT-EMITTING DEVICE WITH ADJUSTABLE CHARGE CARRIER INJECTION

(75) Inventors: Hans-Peter Loebl, Monschau-Imgenbroich (DE); Holger Kalisch, Kaarst (DE); Frank Otto Jessen, Aachen (DE); Christoph Zimmermann, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 694 days.

(21) Appl. No.: 12/746,939

(22) PCT Filed: Dec. 10, 2008

(86) PCT No.: PCT/IB2008/055195
§ 371 (c)(1),
(2), (4) Date: Jun. 9, 2010

(87) PCT Pub. No.: WO2009/077935
PCT Pub. Date: Jun. 25, 2009

(65) Prior Publication Data
US 2010/0265236 A1 Oct. 21, 2010

(30) Foreign Application Priority Data

Dec. 14, 2007 (EP) ..................................... 07123193

(51) Int. Cl.
*G09G 5/00* (2006.01)
*H01L 29/20* (2006.01)
(52) U.S. Cl.
USPC ............................. 345/211; 345/204; 257/89

(58) Field of Classification Search
USPC ............. 345/75.2, 76, 78, 204–211; 313/498, 313/503, 506; 315/169.3, 291; 257/40, 80, 257/89, E51.02
See application file for complete search history.

(56) References Cited

U.S. PATENT DOCUMENTS

| 4,127,861 | A | 11/1978 | Deneuville |
| 5,200,668 | A | 4/1993 | Ohashi et al. |
| 7,067,841 | B2 * | 6/2006 | Parker ............................ 257/40 |
| 7,244,997 | B2 * | 7/2007 | Appelbaum et al. .......... 257/425 |
| 7,582,508 | B2 * | 9/2009 | Park ................................ 438/99 |
| 7,829,917 | B1 * | 11/2010 | Thomas ......................... 257/198 |

(Continued)

FOREIGN PATENT DOCUMENTS

| EP | 1221719 A2 | 7/2002 |
| EP | 2009700 A1 | 12/2008 |

(Continued)

*Primary Examiner* — Prabodh M Dharia
(74) *Attorney, Agent, or Firm* — Mark L. Beloborodov

(57) ABSTRACT

Disclosed is an organic light-emitting device operating similarly to a bipolar transistor. The device includes a collector layer including at least one organic light-emitting layer arranged between a first electrode and a second electrode. The first electrode includes a first emitter layer and a first base layer arranged between the first emitter layer and the collector layer, and the second electrode includes a second emitter layer and a second base layer arranged between the second emitter layer. and the collector layer. In case of a display device, the first emitting layer and the first base layer are structured in order to form an array of pixels of first electrodes suitable to be operated separately by an operation unit in a forward bias mode or a reverse bias mode in order to switch light emission of the EL-layer above each pixel on/off.

13 Claims, 2 Drawing Sheets

(56) References Cited

U.S. PATENT DOCUMENTS

| | | |
|---|---|---|
| 8,120,242 B2 * | 2/2012 | Yokoyama et al. ............ 313/504 |
| 2005/0007323 A1 * | 1/2005 | Appelbaum et al. ............ 345/87 |
| 2005/0014026 A1 * | 1/2005 | Park ............................ 428/690 |
| 2005/0218412 A1 | 10/2005 | Kido et al. |
| 2005/0275056 A1 * | 12/2005 | Forrest ......................... 257/479 |
| 2006/0131568 A1 * | 6/2006 | Meng et al. .................... 257/40 |
| 2006/0138941 A1 * | 6/2006 | Wittmann ..................... 313/504 |
| 2006/0145144 A1 | 7/2006 | Lee et al. |
| 2006/0181203 A1 | 8/2006 | Meng et al. |
| 2006/0236923 A1 * | 10/2006 | Kouvetakis et al. ........... 117/108 |
| 2007/0029547 A1 * | 2/2007 | Parker ........................... 257/40 |
| 2007/0241670 A1 * | 10/2007 | Sapochak et al. ............. 313/504 |
| 2007/0295994 A1 * | 12/2007 | Mochizuki et al. ........... 257/197 |
| 2009/0044863 A1 * | 2/2009 | Marder et al. ................. 136/263 |
| 2009/0108749 A1 * | 4/2009 | Yokoyama et al. ........... 313/504 |
| 2012/0113396 A1 * | 5/2012 | Chiang ........................... 353/31 |

FOREIGN PATENT DOCUMENTS

| | | |
|---|---|---|
| JP | 5451782 | 4/1979 |
| JP | 60206073 A | 10/1985 |
| JP | 61093663 A | 5/1986 |
| WO | 02102117 A1 | 12/2002 |
| WO | 2007119490 A1 | 10/2007 |

\* cited by examiner

ORGANIC LIGHT-EMITTING DEVICE WITH ADJUSTABLE CHARGE CARRIER INJECTION

FIELD OF THE INVENTION

This invention relates to organic light-emitting devices (OLEDs) and displays comprising such OLEDs with adjustable charge carrier injection and to methods to operate such OLEDs and displays.

BACKGROUND OF THE INVENTION

OLEDs are light-emitting devices with a number of layers arranged on top of each other (layer stack) comprising at least one organic light-emitting layer (EL-layer) arranged between two electrodes (anode and cathode). The light is emitted by excited light-emitting molecules (possibly embedded in an organic matrix material) of the EL-layer. The light-emitting molecules are excited by transfer of the recombination energy of electron-hole pairs to the light-emitting molecules within a recombination zone somewhere in the EL-layer. The electrons and holes (charge carriers) are injected from the electrodes into the organic layer stack due to the operating voltage establishing an electric field in the EL layer also responsible for the transport of the charge carriers through the organic layer stack. In common OLEDs, the injection is determined by the applied voltage, the work function of the electrodes and the electrical properties of the OLED layer stack. OLEDs can only be operated in an effective way, if the OLED layer stack is well balanced. An OLED is well balanced, if the recombination zone is located within the EL-layer and the number of charger carriers of both types is suitably adjusted in order to prevent charge carriers to reach the opposite electrode (electrons→anode or holes→cathode). A recombination zone mainly outside the EL-layer would increase the losses of recombination energy via non-emitting channels. Also holes or electrons reaching the opposite electrodes are not able to excite the light-emitting molecules. Additionally, layers not designed for load with the wrong type of charge carriers could show a worse lifetime behavior. Therefore, common OLEDs further comprise additional hole and/or electron transport layers, blocking layers or injection layers of adapted thicknesses. After manufacturing the OLED, the injection of charge carriers and their transport properties through the stack can only be varied by changing the operation voltage. The charge carrier mobility is significantly different between electron and holes. Additionally, the charge carrier mobility is field or carrier concentration dependent and thus will vary with the applied voltage in a complicated manner. For instance, a recombination zone mainly located outside the EL-layer can be re-located by adjusting the operation voltage, but the charge carrier concentration and the width of the recombination zone will be also changed. This could result in a significant number of charge carriers reaching the opposite electrode or stress organic layers only designed for being loaded with the other type of charge carriers. It is therefore desirable to be able to adjust the injection of charge carriers into the organic layer stack independently from the operation voltage determining the transport of the charge carriers within the organic layer stack.

SUMMARY OF THE INVENTION

It is therefore an object of the present invention to provide an organic light-emitting device where the injection of charge carriers can be adjusted independently from the operation voltage.

This object is achieved by an organic light-emitting device suitable to be operated analogue to a bipolar transistor comprising at least one organic light-emitting layer as a collector layer arranged between a first electrode and a second electrode, where the first electrode comprises a first emitter layer and a first base layer arranged between the first emitter layer and the collector layer.

The term "at least one organic light-emitting layer" denotes an organic layer stack located between first and second electrode. In an embodiment, this layer stack may consist of only one organic light-emitting layer. In other embodiments, the organic layer stack may comprise additional layers such as hole/electron transport layers, hole/electron injection layers and/or hole/electron blocking layers as well as different organic light-emitting layers emitting light of different colors.

The term "emitter layer" denotes the injection/diffusion of charge carriers into the base layer ("emitting of charge carriers") in contrast to the term "emitting layer" for the emission of light as used for the organic light-emitting layer.

The term "bipolar transistor" comprises all kinds of bipolar transistors such as bipolar junction transistors, hetero-bipolar transistors and organic transistors. Two in principle different bipolar transistors are known, an npn-transistor and a pnp-transistor. The bipolar transistor comprises one np-diode and one pn-diode, the emitter-base diode and the base-collector diode. The terms "n" and "p" denote layers comprising semiconducting material doped with atoms delivering electrons (n-doped) or holes (p-doped) to the conduction or valence band of the semiconductor. The base-collector diode is responsible for light emission and charge transport through the organic layer stack, while the emitter-base diode is used for charge injection control. One characteristic of a bipolar transistor is the possibility to apply a first voltage between collector layer and base layer ($U_{CB}$) and a second voltage between the emitter layer and the base layer ($U_{EB}$) independently to operate base-collector diode and emitter-base diode independently. The organic light-emitting layer is electrically connected to the second electrode. According to one embodiment of the present invention, $U_{CB}$ is applied between the second electrode and the first base layer as a part of the first electrode. Thus $U_{CB}$ corresponds to the operation voltage $U_{Drive}$ of a common OLED with two conventional metal electrodes.

The effect of the operation of an OLED with adjustable charge carrier injection according to the present invention is as follows:

In an npn-bipolar transistor, a positive base (B) current controls the positive collector (C) current. Here, a positive current direction denotes a current directed towards the transistor. In case of $U_{CB}$>0, the base-collector diode is reversely biased.

a) Let assume $U_{EB}$=0. The emitter layer (E) used for electron injection, is separated from the organic layer stack (collector layer) by a p-doped base layer. Ideally, no electrons are injected here despite $U_{CB}$>0. In this case, the OLED is only a single charge (hole) carrier device not able to emit light.

b) When a forward bias at the emitter-base diode ($U_{EB}$<0) is applied, electrons will diffuse from the emitter layer through the base layer into the collector layer (organic layer stack). The base current is typically two orders of magnitude smaller than the resulting collector current. The base layer will therefore (independently of $U_{CB}$) be flooded with electrons, which are then available for injection into the organic layer stack, e.g. the organic light-emitting layer (collector C) in order to generate electroluminescent light. The electron concentration at the base-emitter interface will increase so much, that by diffusion and by $U_{CB}>0$ electrons will be injected into the organic layer stack, which can be controlled by $U_{EB}$ without influencing $U_{CB}$. In the n-doped emitter layer and the p-doped base layer, diffusion tails consisting of minority charge carriers are present. If the emitter-base diode is sufficiently biased in forward direction, the diffusion tail of the electrons within the base layer can increase until it reaches the base-collector junction. These electrons are subsequently injected into the reverse biased base-collector junction and thus into the organic layer stack organic light-emitting layer also leading to electroluminescent light emission.

The injection method described above is independently of the first voltage (base-collector voltage). The method correspondingly holds for the injection of holes into an OLED, where the organic layer stack is arranged on top of an n-doped base layer, which is on top of a p-doped emitter layer. Here again, the organic layer stack (organic light-emitting layer) serves as the collector layer.

With independently adjustable charge injection (via $U_{EB}$) and charge transport (via $U_{CB}$), position and width of the recombination zone can be varied while maintaining a good charge carrier balance partly predetermined by the present layer stack and layer materials. Variations in layer thickness, material composition, material properties of the organic layer stack leading to the previously described problems can now be easily compensated by suitable adjustment of $U_{EB}$ and $U_{CB}$. A well-placed recombination zone and a simultaneously well maintained/adjusted charge carrier balance maximize the efficiency w.r.t. light output and minimize negative effects on life-time due to charge carriers penetrating the recombination zone towards the opposite electrode. Eventually, electron and/or hole blocking layers can be avoided because of a well-adjusted charge carrier balance, which reduces the preparation effort and therefore preparation costs. The load of the hole transporting layer with electrons or electron transporting layers with holes can be reduced or ideally avoided. Another advantage is the low required voltage $U_{EB}$ to control the current flow through the organic layer stack. The OLED device according to the present invention is switchable fast between a "light-on" and a "light-off" mode, and the switched base current can be significantly smaller than the total OLED (C and E) current. In the "light-on" mode the second electrode injects charge carriers into the organic layer, while in the "light-off" mode the first electrode injects no charge carriers or a negligible amount of charge carriers into the organic layer. The properties of charge carrier injection of the second electrode will not be influenced by switching the first electrode between light-on mode and light-off mode.

As materials for base- and emitter layers, any semiconducting material can be used, e.g. n- or p-doped silicon.

In an embodiment, the first electrode is transparent for visible light. If the OLED is prepared in a layer sequence substrate/first electrode/organic layer stack/second electrode, the OLED can be operated as a bottom emitter (light emission through the substrate) with a reflective second electrode. In case of a layer sequence substrate/second electrode/organic layer stack/first electrode, the OLED can be operated as a top emitter (light emission through the side facing away from the substrate) with either a reflective second electrode or a reflective substrate. Here, a thick reflective second electrode may also serve as a substrate for the applied layer stack. In case of an additionally transparent second electrode, the OLED can be operated as a both-side emitting device. Transparent semiconducting materials for the second electrode are wide band-gap materials. Preferred materials with large band gap comprise at least one material of the group of GaN, InGaN, AlGaN, InAlN, GaInAlN, GaAs, AlGaAs, GaP, InP or oxidic materials such as $In_2O_3$, $SnO_2$, ZnO or $CuAlO_2$. To obtain a transparency for the whole visible spectrum, the band gap (direct or indirect) should be larger than approximately 3 eV.

In another embodiment, the second electrode comprises a second emitter layer and a second base layer arranged between the second emitter layer and the collector layer in order to control also the charge carrier injection of the other type of charge carriers. For instance, the injection of electrons into the organic layer (or layer stack) is controlled via $U_{EB}$ applied to the first emitter layer and first base layer of the first electrode and the injection of holes is controlled via a third voltage $U_{EB2}$ applied to the second emitter and second base layers of the second electrode or vice versa.

In another embodiment, the organic light-emitting layer comprises at least a first sub-layer suitable to emit light of a first color and a second sub-layer to emit light of a second color different to the first color. Here, a shift of the recombination zone by suitable adjusting of $U_{EB}$ and $U_{CB}$ enables an adjustment of the color point of the emitted light. For a first set of $U_{EB}$ and $U_{CB}$, the recombination zone may be located mainly within the first sub-layer leading to a light emission dominated by the first color. For a second set of $U_{EB}$ and $U_{CB}$, the recombination zone may be located mainly within the second sub-layer leading to a light emission dominated by the second color. The same modification is applicable for three or more different sub-layers emitting light of three or more colors to adjust/modify the color point of the superposed light emitted from the OLED device. To achieve light emission of a certain color, it is also possible to operate the OLED in a switched mode, i.e. modulating the emission color under control of $U_{EB}$ and $U_{CB}$ with a switching frequency high enough to ensure a constant color impression by the human eye.

In another embodiment, the emitter layer and the first base layer of the first electrode are structured in order to form an array of pixels of first electrodes suitable to be operated separately. Each pixel can be switched fast between a charge carrier injection mode ($U_{EB}\neq 0$) of the first electrode leading to light emission of the OLED and a non-injection mode ($U_{EB}=0$) of the first electrode leading to no light emission of the OLED. The properties of the charge carrier injection of the second electrode will not be altered. The second electrode will continue with injection of charge carriers of one type, but the corresponding type of charge carriers required for electron-hole recombination and the subsequent light emission is not present during the operation of the first electrode in the non-injection mode (light-off mode). Therefore, parts of the OLED emit light, while parts of the OLED remain non-emitting. The parts can be modified with suitable power supplies.

This invention also relates to a display device with a structured first emitting layer and a structured first base layer of the first electrode in order to form an array of pixels of first electrodes suitable to be operated separately further comprising an operation unit suitable to operate at least some of the pixels independently from the other pixels in a charge carrier injection mode or in a charge carrier non-injection mode. Suited operation units are known by people skilled in the art. In this case, the OLED not only serves as a backlight for a display, but also incorporates the display function itself by providing pixels individually switchable between emitting and non-emitting modes of the organic light-emitting layer arranged on top of the pixels. The display may be a full color display, if the light-emitting layer comprises red, green and blue emitting areas arranged close together. In a preferred embodiment, the OLED comprises not structured, but stacked red, green and blue emitting layer and a structured second electrode to be able to operate also $U_{CB}$ individually for each pixel. In this case, the color variation may be obtained by shifting the recombination zone e.g. from a red emitting layer to a green or blue emitting layer. In a further embodiment, also the first electrode is structured in a similar way as the pixels in order to more precisely switch on/off the light emission of the organic light-emitting layer.

The invention further relates to a method to operate an organic light-emitting device according to claim 1 comprising the steps applying a first voltage $U_{CB}$ between the second electrode and the first base layer in order to adjust the transport of charge carriers through the organic light-emitting layer, and applying a second voltage $U_{EB}$ between the first emitter layer and the first base layer in order to adjust the injection of either electrons or holes from the first electrode into the organic light-emitting layer.

First and second voltages $U_{CB}$ and $U_{EB}$ are adjusted independently. Charge carriers are electrons and holes. A suitable separate adjustment of first and second voltage strongly reduces the probability for charge carriers to reach the opposite electrode leading to a more efficient OLED operation. Charge carriers reaching the opposite electrodes are lost for light generation within the organic light-emitting layer. The organic layer stack located between first and second electrode may comprise only one light-emitting layer. In other embodiments, the organic layer stack may comprise additional layers such as hole/electron transport layers, hole/electron injection layers and/or hole/electron blocking layers as well as different organic light-emitting layers emitting light of different colors. Furthermore, the method enables to operate the OLED in a way, where layers mainly designed for transport of one type of charge carriers are at least less loaded with the other type of charge carriers resulting in a better lifetime performance of these layers. The method above may enable to reduce the number of organic layers of an OLED device by avoiding charge carrier blocking layers.

In an embodiment, the method comprises the step of selecting a suitable first and second voltage to adjusting the position and/or width of a recombination zone to be essentially located within the organic light-emitting layer. In this embodiment, a further improvement of the OLED lifetime will be achieved together with an improved efficiency of the light generation within the organic light-emitting layer. The recombination energy will be released at that location, where the emitting molecules are present. Within the recombination zone, the majority of electrons and holes are bound and therefore cannot penetrate to layers, where the presence of these charge carriers is not desired. The term "essentially" relates to the ratio between thickness of the organic light-emitting layer and the width of the recombination zone. Here, "essentially" corresponds to a ratio of more than 0.8, preferably more than 0.9, more preferred more than 1.0.

In a preferred embodiment, where the organic light-emitting layer comprises at least a first sub-layer suitable to emit light of a first color and a second sub-layer to emit light of a second color different to the first color, the suitable first and second voltages are selected in order to locate the recombination zone essentially in one sub-layer. Here, the color of the emitted light can be modified. If the recombination zone extends over the whole organic light-emitting layer (all sub-layers), the emitted light is the superposition of all the light emitted from the present sub-layers. The number of sub-layers can be different, e.g. 2 layers, 3 layers, and more. In case of three layers emitting red, green and blue light, the superposed emitted light would be white light. With shifted location of the recombination zone, it is possible to shift the color point of the white light (small variation of location and width of the recombination zone). With large variations of width and location of the recombination zone, it would be possible to obtain only red, green or blue light. The previous example is only one possible color modification. Several other different modifications are also adjustable. There are several other emitting colors of the superposed light adjustable depending on the present organic layer stack, the chosen light-emitting materials and the applied first and second voltages. Fast switching between two different colors/brightnesses enables constant impression for the human eye. With such a fast switching between two colors one can achieve an additive color mixing of both colors resulting in an emitted light composed of both colors for a user. In principle, an OLED according to the present invention emitting red, green and blue (3 different light emitting layers) can be operated as a dynamic light source with a light color adjustable to any point within the color space defined by the three basic colors red, green and blue.

In another embodiment the method to operate an OLED device comprising a second emitter layer and a second base layer arranged between the second emitter layer and the collector layer in order to control also the charge carrier injection of the other type of charge carriers further comprising the step applying a third voltage $U_{EB2}$ between the second emitter layer and the second base layer in order to adjust the injection of holes or electrons from the second electrode into the organic light-emitting layer.

If the injection properties of both charge carriers, electrons and holes, can be controlled via $U_{EB}$ and $U_{EB2}$, the adjustment of width and position of the recombination zone can be performed more precisely.

This invention further relates to a method to operate a display device, where the first emitting layer and the first base layer of the first electrode of the organic light-emitting device are structured in order to form an array of pixels of first electrodes suitable to be operated separately and the display device further comprises an operation unit suitable to operate at least some of the pixels independently from the other pixels in a forward bias mode or a reverse bias mode, comprising the steps applying the second voltage $U_{EB}$ in the forward bias mode to the pixel which shall emit light, and applying the second voltage $U_{EB}$ in the reverse bias mode to the pixel, which shall not emit light, and controlling the application of the second voltage in the forward bias mode or reverse bias mode to each pixel via a control unit. Since the injection into the organic layer stack can be steered by $U_{EB}$, this principle can be used to switch a pixel of an OLED display on and off. The invention can therefore also be used to address the pixels of an display device comprising an organic light-emitting device according to the present invention.

DETAILED DESCRIPTION OF EMBODIMENTS

Figure 1:
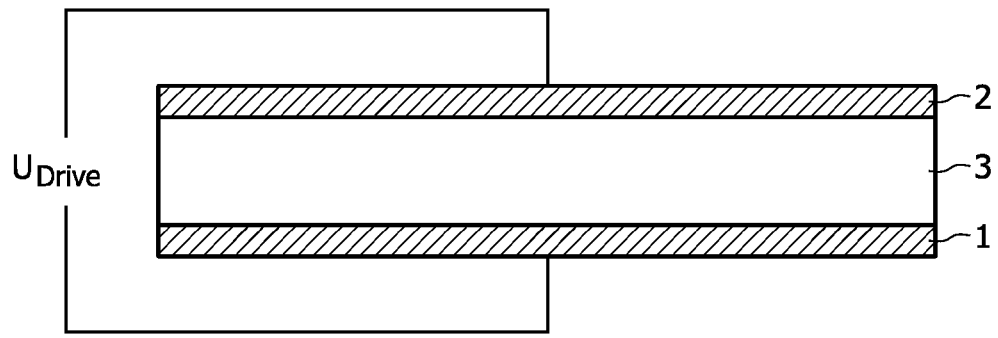
FIG. 1: Prior art OLED operated by a single operation voltage $U_{drive}$.

FIG. 1 shows a side view of an organic light-emitting device according to prior art. The organic light-emitting layer 3 (or layer stack) is arranged between a first electrode 1 and a second electrode 2. In some cases, the organic layer stack comprises only one layer, the organic light-emitting layer 3. In other embodiments, the organic layer stack may comprise additional layers, e.g. hole/electron transport layers, hole/electron injection layers and/or hole/electron blocking layers as well as different organic light-emitting layers emitting light of different colors. The operation voltage $U_{Drive}$ is applied between both electrodes 1 and 2. Assuming electrode 1 as the cathode and electrode 2 as the anode, electrons are injected from cathode 1 while holes are injected from anode 2. The location of the recombination zone (area, where electrons from the cathode and holes from the anode will recombine) depends on structure, design and material properties and applied $U_{Drive}$. Due to the higher mobility of holes compared to electrons, the recombination zone will be close to the cathode 1 at low $U_{Drive}$, and the recombination zone will move towards the anode 2 with increased $U_{Drive}$. Simultaneously, the injection of charge carriers will change as well as the transport properties within the organic light-emitting layer 3 (or layer stack), because the electrical field within the OLED is roughly proportional to $U_{Drive}$. The complicated dependencies of width and location of the recombination zone and the charge carrier injection on $U_{Drive}$ prevents an adjustment, where negative effects such as penetration of charge carriers to the opposite electrodes and/or ineffective light generation can be avoided without extensive layer design of the organic layer stack 3.

Figure 2:
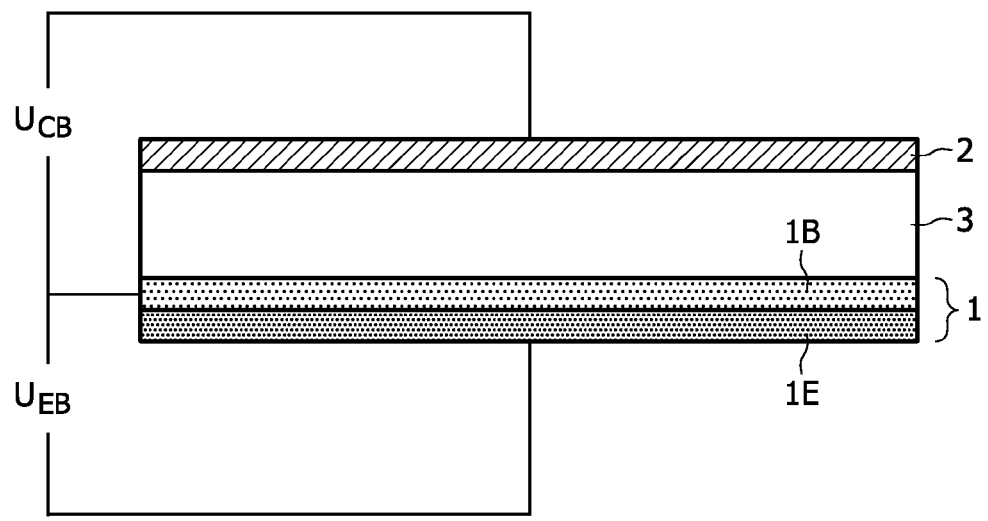
FIG. 2: OLED according to the present invention with a first electrode comprising a first base layer and a first emitter layer.

FIG. 2 shows a schematic side view of an OLED operated like a transistor according to the present invention. Here, the organic light-emitting layer 3 (or the organic layer stack in case of more than one organic layers) serves as the collector layer 3 with a second electrode 2 arranged on top of the collector layer 3. The first electrode 1 comprises two different layers, a first base layer 1B and a first emitter layer 1E, where the first base layer 1B is arranged between the first emitter layer 1E and the organic light-emitting layer 3 (or the organic layer stack in case of more than one organic layers). In contrast to prior art, the OLED according to the present invention can be operated with two voltages $U_{CB}$ and $U_{EB}$ independently adjustable. $U_{CB}$ denotes the voltage applied between second electrode 3 and first base layer 1B (via first electrode 1), $U_{EB}$ denotes the voltage applied between first emitter layer 1E and first base layer 1B. The complete layer stack may be prepared on a substrate not shown here, e.g. glass or plastic substrate, rigid or flexible. In alternative embodiments, a thick electrode 1 or 2 may also serve as a substrate. At least one electrode 1 or 2 has to be transparent to serve as the emitting surface of the OLED. If electrode 2 is the emitting surface, the electrode material may be indium-tin-oxide (ITO) or other transparent and electrically conducting material. If the material of electrode 2 is a non-transparent conducting material, e.g. Al or Ti, the other electrode 1 must be transparent. An emitter-base double layer 1B, 1E may comprise n-doped and p-doped semiconducting materials. In case of transparent layers, the conducting material should be a wide band gap material. For full transparency within the whole visible spectrum the band gap should be larger than 3 eV. Depending on the application and the desired emission color of the OLED, the band gap could also be smaller (only transparent for visible light with longer wavelength, e.g. red and/or green light). Suitable wide band gap materials are GaN, InGaN, AlGaN, InAlN, GaInAlN, GaAs, AlGaAs, GaP, InP or oxidic materials such as $In_2O_3$, $SnO_2$, ZnO or $CuAlO_2$. The p- and n-dopants should be atoms able to deliver electrons (n-doped) or holes (p-doped) to the conduction or valence band of the semiconductor material. Suitable dopants are known by people skilled in the art. In case of a non-transparent electrode 1, any semiconducting material can be used, e.g. n- or p-doped silicon. Typical thicknesses of the electrodes 1 and 2, especially for the base- and emitter layers, are roughly 100 nm and 1 µm, respectively, whereby the base layer thickness is preferably determined by the minority carrier diffusion length and the Debye length.

The organic layer stack 3 may comprise only one organic light-emitting layer 3 comprising polymer light emitting structure or a matrix material such as MTDATA (4,4,4-Tris (N-3-methylphenyl-N-phenylamino)triphenylamine) with embedded small light-emitting molecules, e.g. blue-emitting Flrpic, green-emitting $Ir(ppy)_3$ or red-emitting Ir(2t-ppy). In other embodiments, the organic layer stack 3 may comprises additional layer such as hole transport layer (e.g.: α-NPD) and/or electron transport layer (e.g.: $Alq_3$ or TPBI), hole injection layer (e.g.: NHT1:NDP2) and/or electron injection layer (e.g.: NET5:NDN1) arranged between transport layers and electrodes, hole blocking layer (Rubrene doped α-NPD) arranged between the organic light emission layer and the electrodes to prevent charge carriers reaching the opposite electrode. Typical layer thicknesses for the organic layers vary between 10 nm and 500 nm.

A first embodiment comprises an OLED designed analog to an npn-transistor with an organic light-emitting layer 3 as collector (C). When applying a positive base-collector voltage $U_{CB}$, a positive potential is present at the top-electrode (electrode 2 connected to C) to inject holes into layer 3. The other contact, which is used for electron injection, consists of the first base layer of p-doped semiconductor material (1B) and the first emitter layer (1E) of highly n-doped semiconductor material. Ideally, also no electrons are injected here when $U_{EB}=0$ (despite $U_{CB}>0$). When we apply now a forward bias at the emitter-base diode ($U_{EB}<0$), electrons will diffuse from the first emitter layer 1E through the first base layer 1B into the collector layer 3 (C). The current through the first base layer 1B is typically two orders of magnitude smaller than the current through the collector layer 3, here the organic light-emitting layer 3 (or layer stack). The first base layer 1B will therefore (independently of $U_{CB}$) be flooded with electrons, which are then available for injection into the collector layer 3.

A second embodiment comprises an OLED designed analog to an npn-transistor, where an emitter-base-voltage $U_{EB}>0$ opposite to the first embodiment is applied. An OLED device is deposited onto a thin p-Si layer (first base layer 1B), which is on top of an n-Si first emitter layer 1E. As p-conductor, the first base layer 1B allows only poor injection of electrons at $U_{EB}>0$ into the organic layer 3 despite the positive $U_{CB}$. The electrical field in the organic stack 3 can be controlled by $U_{CB}$ without determining herewith, as with conventional OLEDs, the electron current in the OLED device. The second electrode 2 in this OLED structure may be a transparent conducting anode such as Indium Tin Oxide. In the n-doped first emitter layer 1E and the p-doped first base layer 1B, 'diffusion-tails' consisting of the minority carriers (p* in the n-doped emitter and n* in the p-doped base) is present. If the E-B-junction is sufficiently biased in forward direction, n* can increase until its 'diffusion-tail' reaches the C-B junction. These electrons n* are subsequently injected into the reverse biased C-B-junction and thus into the organic light-emitting layer 3 (or layer stack).

It is important to notice that the conduction band of the p-doped base material should be above, or equal to the corresponding transport band in the organic light-emitting layer 3 (or layer stack) which would be in this example the LUMO (lowest unoccupied molecular orbital). In a preferred embodiment the thickness of the first base layer 1B is less than the diffusion length and higher the Debye length of electrons in p-doped silicon.

The injection method described above can, of course, easily be extended to the injection of holes into an OLED. In this case, we would grow the OLED layer stack on top of an n-doped first base layer 1B, which is on top of a p-doped first emitter layer 1E. The organic light-emitting layers 3 (or layer stack) would again serve as collector layer C.

When bipolar Si-diodes (n-p- or p-n) are used to serve as controllable injecting contact, the OLED grown on top should preferably be a top emitting OLED with either a transparent anode 2 or a transparent cathode 2 on top of the uppermost organic layer 3.

Furthermore, we can extend the invention to III-V-semiconductors, II-VI-semiconductors, hetero-bipolar transistors, and organic transistors providing n-p or p-n structures serving as controllable injection contact of an OLED.

Figure 3:
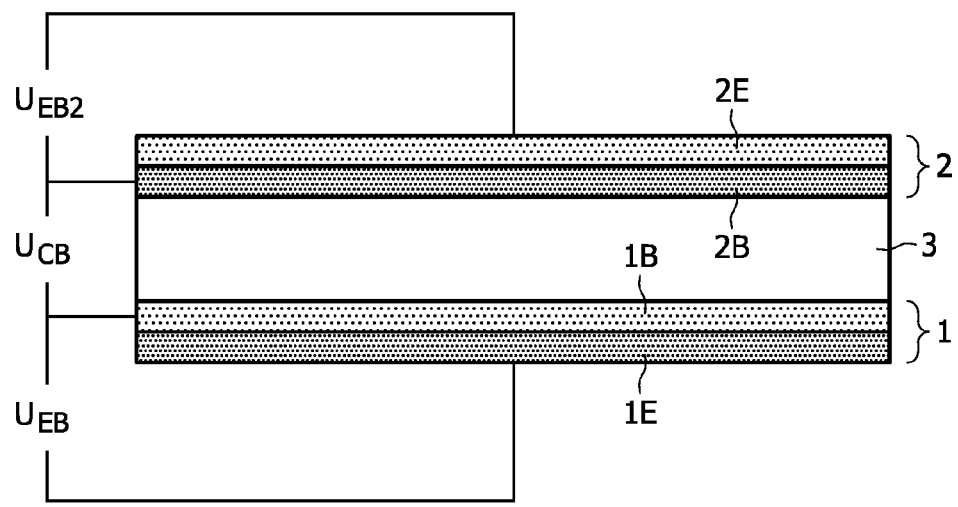
FIG. 3: OLED according to the present invention with a second electrode comprising a second base layer and a second emitter layer additional to the first electrode comprising a first base layer and a first emitter layer.

In another embodiment the organic light-emitting device comprises two injection-controllable electrodes (both of former type) is feasible offering a separate control of injection of both carrier types as well as of the voltage across the organic layer (stack) 3, as shown in FIG. 3. Here, additionally to the first electrode 1 with first emitter 1E and first base layer 1B, the second electrode 2 comprises a second emitter layer 2E and a second base layer 2B arranged between second emitter layer 2E and organic light emitting layer 3 (or organic layer stack 3). A third voltage $U_{EB2}$ can be applied between second emitter layer 2E and second base layer 2B in order to control the charge carrier injection properties also from the second electrode 2 into the organic layer 3 (or layer stack 3). The charge carrier injection will be controlled in an analog procedure as described before for the first electrode 1 and $U_{EB}$. The second electrode 2 may be transparent, if wide band-gap semiconductor material is applied for second emitter layer 2E and second base layer 2B. In case of a non-transparent second electrode 2, any semiconductor material can be applied or an additional reflective layer (e.g. Al) is arranged on top of the second emitter layer 2E.

Figure 4:
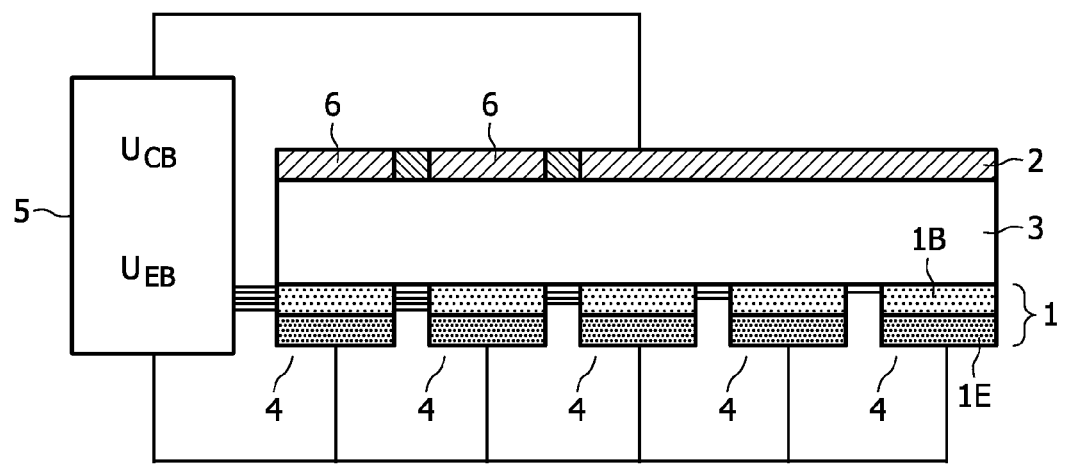
FIG. 4: Display device with OLED according to the present invention

Since the injection into the organic light-emitting layer (or layer stack) can be steered by $U_{EB}$, we can use this principle also to switch a pixel of an OLED display on and off. The invention can therefore also be used to address the pixels 4 of an OLED display as shown in FIG. 4. The first electrode 1, 1B, 1E may be structured in an individual array of first base layer—first emitter layer pixels 4, where each pixel 4 is contacted individually to an operation unit 5 to address a pixel-related voltage $U_{EB}$ according to an operation signal comprising the video information to be displayed on the display device. Such operation unit 5 and suitable pixel pattern (size, arrangement) to achieve individual addressing are known by people skilled in the art. For a more precisely control of the light emission properties of the light-emitting layer 3 arranged on top of the pixels 4, the second electrode 2 may be structured in at least a similar pattern like the pixels 4, as indicated with reference number 6 in FIG. 4. Alternatively, the second electrode is not structured as indicated in FIG. 4 on the right side of the electrode 2. The individual potential for each pixel can be the collector, base or the emitter potential or two or all of them.

In a further embodiment, the OLED display device may additionally comprise a second electrode with second emitter layer a second base layer, preferably structured in pixel comprising second emitter and base layer.

The particular combination of elements and features in the above detailed embodiments are exemplary only; the interchanging and substitution of these teachings with other teachings in this are also expressly contemplated. As those skilled in the art will recognize, variations, modifications, and other implementations of what is described herein can occur to those of ordinary skill in the art without departing from the spirit and the scope of the invention as claimed. Accordingly, the foregoing description is by way of example only and is not intended as limiting. The invention's scope is defined in the following claims and the equivalents thereto. Furthermore, reference signs used in the description and claims do not limit the scope of the invention as claimed.

The invention claimed is:

1. An organic light-emitting device operating similarly to a bipolar transistor, the device comprising a collector layer arranged between a first electrode and a second electrode and comprising at least one organic light-emitting layer, the first electrode comprising a first emitter layer and a first base layer arranged between the first emitter layer and the collector layer, and the second electrode comprising a second emitter layer a second base layer arranged between the second emitter layer and the collector layer.

2. The organic light-emitting device according to claim 1, wherein the first electrode is transparent for visible light.

3. The organic light-emitting device according to claim 2, wherein the material of the first electrode is selected from the group consisting of: GaN, InGaN, AlGaN, InAlN, GaInAlN, GaAs, AlGaAs, GaP, InP or oxidic materials, including $In_2O_3$, $SnO_2$, ZnO or $CuAIO_2$ in one or more doping state (s).

4. The organic light-emitting device according to claim 1, wherein the organic light-emitting layer comprises at least a first sub-layer suitable to emit light of a first color and a second sub-layer to emit light of a second color different to the first color.

5. The organic light-emitting device according to claim 1, wherein the first emitter layer and the first base layer of the first electrode are structured in order to form an array of pixels of first electrodes suitable to be operated separately.

6. A method to operate an organic light-emitting device according to claim 1, the method comprising the steps of:
applying a first voltage $U_{CB}$ between the second electrode and the first base layer in order to adjust the transport of charge carriers through the organic light-emitting layer,
applying a second voltage $U_{EB}$ between the first emitter layer and the first base layer (in order to adjust the injection of either electrons or holes from the first electrode into the organic light-emitting layer, and
applying a third voltage $U_{EB2}$ between the second emitter layer arid the second base layer in order to adjust the injection of holes or electrons from the second electrode into the organic light-emitting layer.

7. The method according to claim 6, further comprising the step of selecting a suitable first and second voltage $U_{CB}$ and $U_{EB}$ to adjust the position and/or width of a recombination zone to be essentially located within the organic light-emitting layer.

8. The method according to claim 6, wherein the organic light-emitting layer comprises at least a first sub-layer suitable to emit light of a first color and a second sub-layer to emit light of a second color different to the first color and that the suitable first and second voltages $U_{CB}$ and $U_{EB}$ are selected in order to locate the recombination zone essentially in one sub-layer.

9. The organic light-emitting device according to claim 1, wherein the organic light-emitting layer comprises a polymer light emitting structure.

10. The organic light-emitting device according to claim 1, wherein the organic light-emitting layer comprises a matrix material with embedded light-emitting molecules.

11. The organic light-emitting device according to claim 10, wherein the matrix material comprises 4,4,4-Tris(N-3-methylphenyl-N-phenylamino)triphenylamine.

12. The organic light-emitting device according to claim 1, wherein the organic light-emitting layer has a thickness ranging from 10 nm to 500 nm.

13. A display device, comprising
   an organic light-emitting device operating similarly to a bipolar transistor, the device comprising a collector layer arranged between a first electrode and a second electrode and comprising at least one organic light-emitting layer, the first electrode comprising a first emitter layer and a first base layer arranged between the first emitter layer and the collector layer, and the second electrode comprising a second emitter layer a second base layer arranged between the second emitter layer and the collector layer, wherein the first emitter layer and the first base layer of the first electrode are structured in order to form an array of pixels of first electrodes suitable to be operated separately; and
   an operation unit suitable to operate at least some of the pixels independently from the other pixels in a forward bias mode or a reverse bias mode.

* * * * *